United States Patent
Maeda et al.

(10) Patent No.: US 10,062,736 B2
(45) Date of Patent: Aug. 28, 2018

(54) DISPLAY DEVICE HAVING VARYING DISTANCES BETWEEN REFLECTING LAYERS

(71) Applicant: Japan Display Inc., Minato-ku (JP)

(72) Inventors: Norihisa Maeda, Minato-ku (JP); Takahiro Ushikubo, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/420,704

(22) Filed: Jan. 31, 2017

(65) Prior Publication Data

US 2017/0250231 A1 Aug. 31, 2017

(30) Foreign Application Priority Data

Feb. 26, 2016 (JP) ................................. 2016-036010

(51) Int. Cl.
*H01L 27/32* (2006.01)
*H01L 51/52* (2006.01)

(52) U.S. Cl.
CPC ...... *H01L 27/3206* (2013.01); *H01L 51/5218* (2013.01); *H01L 51/5265* (2013.01); *H01L 51/5271* (2013.01); *H01L 27/322* (2013.01); *H01L 27/3213* (2013.01)

(58) Field of Classification Search
CPC ............ H01L 27/3206; H01L 51/5218; H01L 51/5265; H01L 51/5271; H01L 27/3213; H01L 27/322
See application file for complete search history.

(56) References Cited

U.S. PATENT DOCUMENTS

| | | | | |
|---|---|---|---|---|
| 7,969,087 B2* | 6/2011 | Hwang | ............... | H01L 27/3213 313/504 |
| 8,064,124 B2* | 11/2011 | Chung | ............... | B81C 1/00801 359/290 |
| 8,223,096 B2* | 7/2012 | Hwang | ............... | H01L 27/3213 313/498 |
| 8,427,047 B2* | 4/2013 | Choi | ................... | H01L 27/3213 313/504 |
| 8,922,112 B2* | 12/2014 | Kobayashi | .......... | H01L 51/5036 313/504 |
| 9,172,059 B2* | 10/2015 | Seo | ...................... | H01L 27/3211 |
| 9,887,390 B2* | 2/2018 | Kim | ..................... | H01L 51/5284 |
| 2005/0225232 A1* | 10/2005 | Boroson | ............. | H01L 27/3213 313/504 |

(Continued)

FOREIGN PATENT DOCUMENTS

JP 2011-165664 A 8/2011

*Primary Examiner* — Ida M Soward
(74) *Attorney, Agent, or Firm* — Oblon, McClelland, Maier & Neustadt, L.L.P.

(57) ABSTRACT

A reflecting layer is provided for each of a white pixel PW and a plurality of chromatic color pixels PR, PG and PB. A semitransparent reflecting layer is provided for each of the white pixel PW and the plurality of chromatic color pixels PR, PG and PB. The distance between the reflecting layer and the semitransparent reflecting layer in the white pixel PW is larger than the largest distance among distances between the reflecting layer and the semitransparent reflecting layer in the chromatic color pixels PR, PG, PB. Such display device can suppress increase in manufacturing cost and obtain both merits of optical micro-cavity structure and of the white pixel.

10 Claims, 5 Drawing Sheets

(56) References Cited

U.S. PATENT DOCUMENTS

| | | | |
|---|---|---|---|
| 2006/0290274 A1* | 12/2006 | Oota | H01L 27/3211 313/506 |
| 2010/0052524 A1* | 3/2010 | Kinoshita | H01L 27/3213 313/504 |
| 2010/0060148 A1* | 3/2010 | Hwang | H01L 27/3213 313/504 |
| 2011/0198629 A1* | 8/2011 | Lee | H01L 27/3213 257/89 |
| 2011/0273080 A1* | 11/2011 | Kimura | H01L 27/3213 313/498 |
| 2013/0242237 A1* | 9/2013 | Nagato | G02F 1/133509 349/105 |
| 2014/0159007 A1* | 6/2014 | Song | H01L 27/3213 257/40 |
| 2015/0263076 A1* | 9/2015 | Seo | H01L 27/3213 257/40 |
| 2015/0318334 A1* | 11/2015 | Kim | H01L 27/3213 257/40 |
| 2018/0019285 A1* | 1/2018 | Seo | H01L 33/44 |

* cited by examiner

DISPLAY DEVICE HAVING VARYING DISTANCES BETWEEN REFLECTING LAYERS

CROSS-REFERENCE TO RELATED APPLICATION

The present application claims priority from Japanese application JP2016-036010 filed on Feb. 26, 2016, the content of which is hereby incorporated by reference into this application.

BACKGROUND OF THE INVENTION

1. Field of the Invention

The present patent specification relates to a display device and more particularly to a display device employing light-emitting elements such as organic electroluminescent (EL) elements in pixels

2. Description of the Related Art

Some organic EL display devices have an optical micro-cavity structure where a distance between a reflecting layer and a semitransparent reflecting layer in pixels is regulated according to wavelength of light emitted from a light emitting layer. In most of the devices, the reflecting layer and the semitransparent reflecting layer are employed as electrodes, and the light emitting layer is formed between the reflecting layer and the semitransparent reflecting layer. The light emitted from the light emitting layer repeatedly reflects on and between the semitransparent reflecting layer and the reflecting layer. Consequently, light having wavelength that matches to the light path length (distance) between the semitransparent reflecting layer and the reflecting layer is intensified to pass through the semitransparent reflecting layer. Such micro-cavity structure improves color purity of light and luminous efficiency.

Some organic EL display devices include a white pixel in addition to chromatic color pixels such as a red pixel, a green pixel, and a blue pixel. The white pixel contributes to improve the luminance of an image and reduce the power consumption.

As described above, the micro-cavity structure intensifies only light having a particular wavelength that matches to the light path length. Therefore, a white pixel having the micro-cavity structure would not emit pure white light. Accordingly, the micro-cavity structure is not good to the white pixel. In regard to this problem, the display device described in JP2011-165664A includes the micro-cavity structure in the chromatic color pixels and does not include the semi-transparent reflecting layer in the white pixel. That is, the micro-cavity structure is not formed in the white pixel. Such display device has both of the advantage obtained from the white pixel and the advantage obtained from the micro-cavity structure formed in the chromatic color pixels.

SUMMARY OF THE INVENTION

However, the structure described in JP2011-165664A requires, in manufacturing the device, to pattern the semi-transparent reflecting layer in accord with positions of the white pixels and the chromatic color pixels. The patterning process increases cost in manufacturing the device.

One of objects of the present disclosure is to provide a display device having both of an advantage obtained from a white pixel and an advantage obtained from a micro-cavity structure, while avoiding increase of cost in manufacturing.

An embodiment of the display device includes a white pixel that emits white light, a plurality of chromatic color pixels that respectively emit light of a plurality of chromatic colors different from each other, the plurality of chromatic colors including a first color and a second color, a first reflecting layer formed on the white pixel and the plurality of chromatic color pixels, and a second reflecting layer formed on the white pixel and the plurality of chromatic color pixels, the second reflecting layer and the first reflecting layer facing to each other. The chromatic color pixel that emits light of the first color is different from the chromatic color pixel that emits light of the second color in distance between the first reflecting layer and the second reflecting layer. A distance between the first reflecting layer and the second reflecting layer in the white pixel is larger than the largest distance among distances between the first reflecting layer and the second reflecting layer in the respective chromatic color pixels.

In the above described display device, the distance between the first reflecting layer and the second reflecting layer in the white pixel is larger than the largest distance among distances between the first reflecting layer and the second reflecting layer in the respective chromatic color pixels. Accordingly, the display device can make optical interference hardly occur in the white pixel and thus make color of light emitted from the white pixel pure to utilize an advantage of the white pixel. Further, in the above described display device, the chromatic color pixel that emits light of the first color is different from the chromatic color pixel that emits light of the second color in distance between the first reflecting layer and the second reflecting layer. Accordingly, the display device can include a micro-cavity structure and thus have an advantage obtained from the micro-cavity structure. Still further, in the above described display device, the second reflecting layer is formed on the white pixel and the plurality of chromatic color pixels. Accordingly, the display device does not require to pattern the semitranspar-ent reflecting layer in accord with positions of the white pixel and the chromatic color pixels. Thus, the display device can avoid increase of cost in manufacturing.

DETAILED DESCRIPTION OF THE INVENTION

Hereinafter, embodiments according to the present invention will be described. In the present specification, an organic EL display device including an organic LED (Light Emitting Diode) as a light emitting element will be described as an example of the embodiments.

Figure 1:
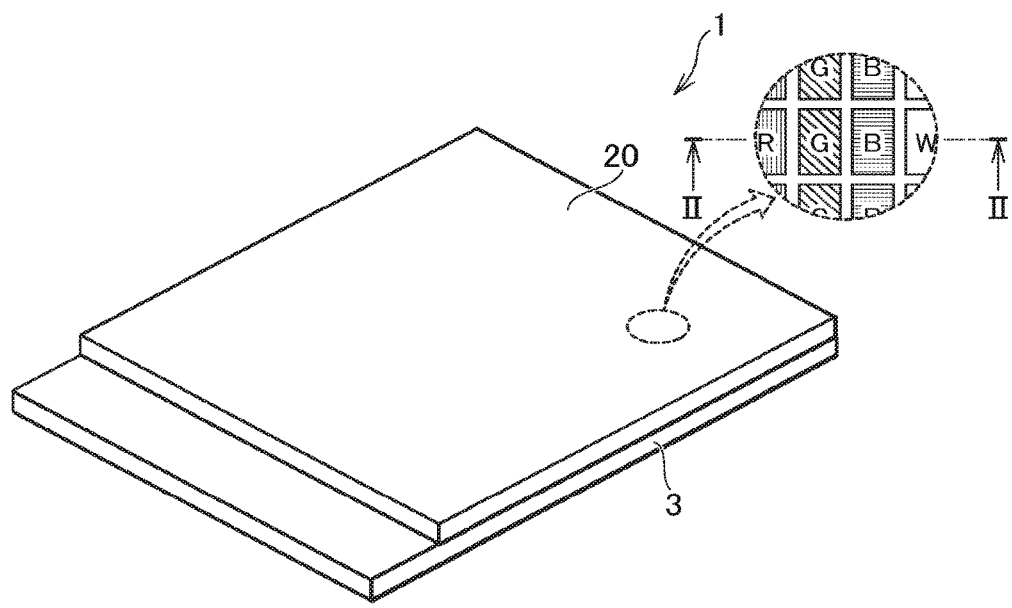
FIG. 1 illustrates an exemplary organic EL display device of embodiments according to the present invention.
Figure 2:
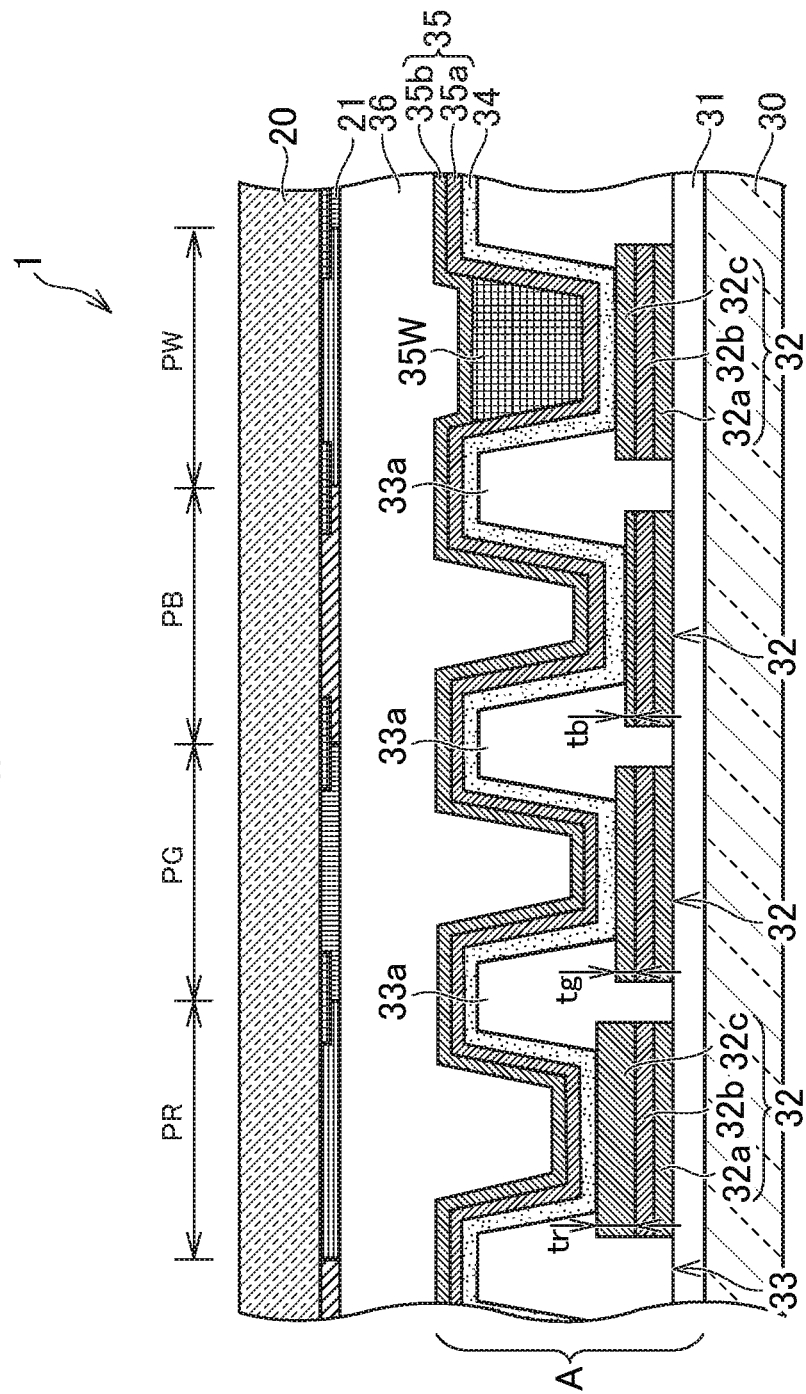
FIG. 2 is a cross section taken along line II-II in FIG. 1.

FIG. 1 illustrates an exemplary organic EL display device of the embodiments according to the present invention. FIG. 2 is a cross section taken along line II-II in FIG. 1. In the following description, an "upward direction" means a direction from the display panel 3 to the opposite substrate 20. On the contrary, a "downward direction" means a direction from the opposite substrate 20 to the display panel 3.

The present specification discloses examples of various embodiments according to the present invention. Embodiments which maintain the spirit of the present invention and are easily modified by those skilled in the art are surely contained in the scope of the invention. In addition, a width, a thickness, and a shape of each portion shown in the drawings are merely an example. The width, the thickness, and the shape shown in the drawings do not limit the interpretation of the invention.

Unless otherwise defined, an expression in the present specification that "an element A is disposed, or formed, on an element B" covers, in interpretation thereof, both of an embodiment in which "an element A is disposed immediately above, and in contact with, an element B" and an embodiment "an element A is disposed above an element B via another element formed between the element A and the element B" (the word "element" described here covers "member", "portion" "layer" or the like). For example, an expression "a circuit layer 31 formed on a substrate 30" should be interpreted to include "a circuit layer 31 formed above, and in contact with, a substrate 30" and "a circuit layer 31 formed above a substrate 30 via one or more layers formed between the circuit layer 31 and the substrate 30".

As shown in FIGS. 1 and 2, the organic EL display device includes a white pixel PW that emits white light and a plurality of chromatic color pixels that respectively emit light of chromatic colors different from each other. In the example of display device 1, a red pixel PR, a green pixel PG, and a blue pixel PB are formed as the chromatic color pixels. The colors of chromatic color pixels are not limited to the example described here. In the examples of FIGS. 1 and 2, the white pixels and the chromatic color pixels are arranged in the horizontal direction, but the arrangement of the pixels is not limited to the example shown in these figures.

As shown in FIG. 2, the display device 1 includes a display panel 3. The substrate 30 of the display panel 3 has a laminated structure A formed thereon. The substrate 30 may be a glass substrate or a resin substrate such as an acrylic substrate. The laminated structure A includes a circuit layer formed on the substrate 30. The circuit layer 31 has a circuit formed therein for controlling light emission of each pixel. An example of the circuit formed in the circuit layer 31 will be described later.

As shown in FIG. 2, the laminated structure A includes a pixel electrode 32 formed in each of the plurality of pixels. In the example of display device 1, the pixel electrode 32 includes a transparent conductive layer 32a, a reflecting layer 32b formed on the transparent conductive layer 32a, and a transparent conductive layer 32c formed on the reflecting layer 32b ("reflecting layer 32b" corresponds to a "first reflecting layer" in the claims). The transparent conductive layers 32a and 32c are formed of a transparent conductive material such as ITO (Indium Tin Oxide) or IZO (Indium Zinc Oxide), for example. The reflecting layer 32b is formed of metal such as Ag, for example. The reflecting layer 32b is lower in light permeability than the semitransparent reflecting layer described later, in other words, an opaque reflecting layer. The pixel electrode 32 does not necessarily include the transparent conductive layer 31a.

As shown in FIG. 2, a bank layer 33 is formed on the pixel electrode 32. The bank layer 33 includes banks 33a each of which partitions two adjacent pixels. The bank 33a overlaps the outer peripheral portion of each pixel electrode 32. The pixel electrode 32 is exposed in an opening formed inside the bank 33a.

As shown in FIG. 2, an organic layer 34 is formed so as to cover the bank 33a and the pixel electrode 32. The organic layer 34 includes light emitting layers. In addition, the organic layer 34 may include an electric charge injection layer (for example, a hole injection layer, an electron injection layer) and an electric charge transport layer (for example, a hole transport layer, an electron transport layer). In the example of display device 1, the light emitting layer of the organic layer 34 is formed in a common structure over the entire display area of the display panel 3, and is configured to emit white light. That is, the light emitting layer of the organic layer 34 has the same structure in all pixels of the display area. For example, a light emitting layer that emits red light, a light emitting layer that emits green light, and a light emitting layer that emits blue light may be stacked in each pixel to form the light emitting layer of the organic layer 34. In another example, the light emitting layer of the organic layer 34 may be configured in each pixel to emit light of the color of the pixel. For example, the light emitting layer may be configured in the red pixel PR to emit red light, the light emitting layer may be configured in the green pixel PG to emit green light, and the light emitting layer may be configured in the blue pixel PB to emit blue light. In this case, the other layers of the organic layer 34 (that is, the electric charge injection layer and the electric charge transport layer) may be formed in common over the entire display area.

As shown in FIG. 2, a common electrode 35 is formed on the organic layer 34. The common electrode 35 includes a transparent conductive layer 35a and a semitransparent reflecting layer 35b (the semitransparent reflecting layer 35b corresponds to the "second reflecting layer" of the claims). The common electrode 35 has a common structure over the plurality of pixels. That is, each of the transparent conductive layer 35a and the semitransparent reflecting layer 35b is formed continuously over the plurality of pixels (for example, all pixels of the display area). The transparent conductive layer 35a is formed of a transparent conductive material such as ITO or IZO, for example. a portion of light incident on the semitransparent reflecting layer 35b passes through the semitransparent reflecting layer 35b, and the rest of the light reflects on the semitransparent reflecting layer 35b. The material of the semitransparent reflecting layer 35b is, for example, an alloy of Mg and Ag. The common electrode 35 may be covered with a barrier layer to prevent moisture from penetrating into the organic layer 34.

As shown in FIG. 2, the white pixel PW includes an optical path length regulating layer 35W, which will be described later, formed between the semitransparent reflecting layer 35b and the transparent conductive layer 35a. On the other hand, the chromatic color pixels (pixels PR, PG, PB in the example of display device 1) do not include the optical path length regulating layer 35W, and thus the semitransparent reflecting layer 35b in the chromatic color pixels is in contact with the transparent conductive layer 35a. The semitransparent reflecting layer 35b is preferably made of a material having conductivity. This makes it possible to lower the resistance of the common electrode 35.

As shown in FIG. 2, the display device 1 includes an opposite substrate 20 facing the display panel 3. In the example of display device 1, color filters 21 are formed on the opposite substrate 20. The position and the color of the color filter 21 correspond to the position and the color of pixel, respectively. The color filter 21 may not be formed in the white pixel PW. Alternatively, the white pixel PW may have a color filter that is not colored. For the display device in which the light emitting layer of the organic layer 34 is formed in respective pixels so as to emit light of the color of the pixel, the color filter 21 may not be formed on the opposite substrate 20. A filler material 36 is disposed between the display panel 3 and the opposite substrate 20.

As described above, each of the plurality of chromatic color pixels includes the reflecting layer 32b constituting the pixel electrode 32. Also, these pixels include the semitransparent reflecting layer 35b facing the reflecting layer 32b. The light emitting layer of the organic layer 34 is formed between the reflecting layer 32b and the semitransparent reflecting layer 35b in each pixel. Therefore, the light emitted from the light emitting layer reflects repeatedly on the reflecting layer 32b and on the semitransparent reflecting layer 35b. The light passes through the semitransparent reflecting layer 35b and then passes through the color filter 21 to exit to the outside.

The semitransparent reflecting layer 35b and the reflecting layer 32b constitute an optical micro-cavity structure in the chromatic color pixels. That is, the distance between the semitransparent reflecting layer 35b and the reflecting layer 32b is regulated according to the wavelength of the light of the color of each chromatic color pixel. As a result, the light emitted from the light emitting layer of the organic layer 34 is repeatedly reflected on the semitransparent reflecting layer 35b and on the reflecting layer 32b to cause optical interference. Therefore, the chromatic color pixel that emits light of a first color and the chromatic color pixel that emits light of a second color are different from each other in distance between the semitransparent reflecting layer 35b and the reflecting layer 32b. For the example of display device 1, the red pixel PR, the green pixel PG, and the blue pixel PB are different from each other in distance between the semitransparent reflecting layer 35b and the reflecting layer 32b. In the example of display device 1, as shown in FIG. 2, the thickness of the transparent conductive layer 32c of the pixel electrode 32 is regulated according to the wavelength of light of the color of each chromatic color pixel. The thickness tr of the transparent conductive layer 32c of the red pixel PR, the thickness tg of the transparent conductive layer 32c of the green pixel PG, and the thickness tb of the transparent conductive layer 32c of the blue pixel PB are regulated according to the color of each pixel, and have a relation of tr>tg>tb.

As shown in FIG. 2, the semitransparent reflecting layer 35b is also formed in the white pixels PW. The semitransparent reflecting layer 35b is continuously formed over the white pixels PW and the chromatic color pixels. Therefore, it is unnecessary to pattern the semitransparent reflecting layer 35b according to the positions of the pixels, and thus it is unnecessary in manufacturing process to use a fine mask for forming the semitransparent reflecting layer 35b. As a result, increase in the manufacturing cost of the display device 1 can be suppressed.

For the white pixel PW, the distance between reflecting layer 32b and the semitransparent reflecting layer 35b is regulated so as not to cause optical micro-cavity effect. More specifically, the distance between the reflecting layer 32b and the semitransparent reflecting layer 35b in the white pixel PW is larger than the largest distance among distances between the reflecting layer 32b and the semitransparent reflecting layer 35b in the respective chromatic color pixels. In the example of display device 1, the red pixel PR, the green pixel PG, and the blue pixel PB are formed as the chromatic color pixels. The red pixel PR has the largest distance among the distances of the three chromatic color pixels between the reflecting layer 32b and the semitransparent reflecting layer 35b. Therefore, the thickness between the reflecting layer 32b and the semitransparent reflecting layer 35b in the white pixel PW is larger than the distance between the reflecting layer 32b and the semitransparent reflecting layer 35b in the red pixel PR so that optical interference does not occur in the white pixel PW.

As shown in FIG. 2, for the example of display device 1, the white pixel PW includes an optical path length regulating layer 35W between the transparent conductive layer 35a and the semitransparent reflecting layer 35b that constitute the common electrode 35. The optical path length regulating layer 35W is formed of a transparent material and is located inside the bank 33a surrounding the white pixel PW. The optical path length regulating layer 35W contributes to secure a sufficient distance between the reflecting layer 32b and the semitransparent reflecting layer 35b so that optical interference does not occur for all components of light emitted from the light emitting layer of the organic layer 34 (for example, red component, green component, blue component in the case of display device 1). The optical path length regulating layer 35W enables the white pixel PW to emit light with a pure white color.

The thickness of the optical path length regulating layer 35W is, for example, 2.0 micrometer (μm) or more, preferably 2.5 μm or more. The thickness of the optical path length regulating layer 35W is more preferably 3.0 μm or more. The optical path length regulating layer 35W having such a thickness can prevent optical interference for all components of light emitted from the light emitting layer of the organic layer 34 and enables the white pixel to emit light with pure white light. In the example of display device 1, the light emitting layer of the organic layer 34 is configured to emit red light, green light, and blue light, and they mix to form white light. The optical path length regulating layer 35W having the thickness as described above can prevent optical interference for the red light, the green light, and the blue light, and as a result, make the white pixel PW emit light with a pure white color.

Figure 3:
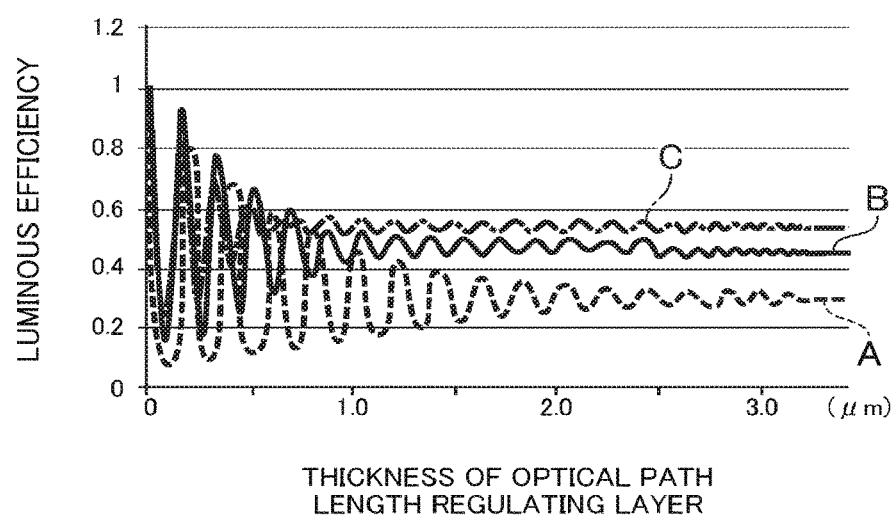
FIG. 3 is a graph for explaining a relation between thickness of an optical path length regulating layer and luminous efficiency.

FIG. 3 is a graph showing a relationship between the thickness of the optical path length regulating layer 35W and luminous efficiency for red light, green light, and blue light. In this figure, the horizontal axis indicates the thickness of the optical path length regulating layer 35W, and the vertical axis indicates luminous efficiency. The luminous efficiency is normalized so that the luminous efficiency is 1 when the thickness of the optical path length regulating layer 35W is 0 μm. A broken line A is for red light, a solid line B is for green light, and a one-dot chain line C is for blue light.

Figure 4:
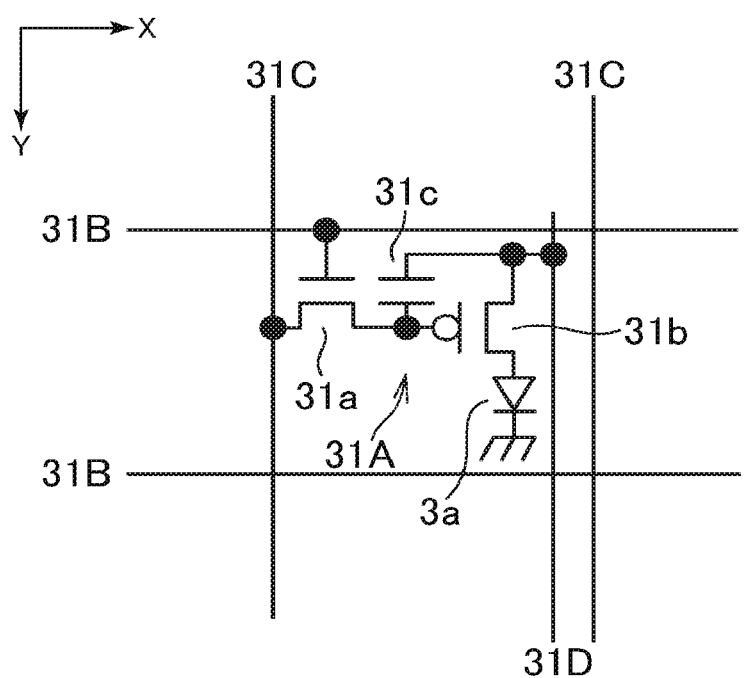
FIG. 4 illustrates an exemplary circuit formed in a circuit layer on a display panel.

As shown in FIG. 3, in the range where the thickness of the optical path length regulating layer 35W is 1.0 μm or less, the luminous efficiency has large change (amplitude) for all colors. The colors have different cycles in change of the luminous efficiency from each other. Therefore, in the range where the thickness of the optical path length regulating layer 35W is 1.0 μm or less, it is difficult to determine a layer thickness that intensifies all the colors uniformly. That is, in this range, it is difficult to determine a layer thickness so that pure white light is realized. If the optical path length regulating layer 35W is set to a certain thickness, only one color is intensified strongly than other colors. On other hand, in the range where the thickness of the optical path length regulating layer 35W is 2.0 μm or more, since the thickness of the optical path length regulating layer 35W is sufficiently thicker than the wavelengths of all the visible lights, the change of the luminous efficiency are small for all the visible lights. Therefore, in such range, the optical interference can be prevented for all the colors. In other words, it is possible to make the intensity of all colors appropriate so that pure white light is realized. Therefore, the thickness of the optical path length regulating layer 35W is preferably 2.0 µm or more for example. As shown in FIG. 4, in the range where the thickness of the optical path length regulating layer 35W is 2.5 µm or more, the change of luminous efficiency is further reduced for all colors. In the range where the thickness of the optical path length regulating layer 35W is 3.0 µm or more, the change of the luminous efficiency is further reduced. Therefore, the thickness of the optical path length regulating layer 35W is preferably 2.5 µm or more, more preferably 3.0 µm or more. As shown in FIG. 2, the upper surface of the optical path length regulating layer 35W may be positioned at the same height as that of the upper surface of the bank 33a or may be positioned higher than the height of the upper surface of the bank 33a.

In the example of display device 1, as shown in FIG. 2, the optical path length regulating layer 35W is formed in the white pixel PW and not in the chromatic color pixels. The optical path length regulating layer 35W like this may be formed by, for example, an inkjet method. This method makes it relatively easy to form the optical path length regulating layer 35W having a large thickness only on the white pixels PW.

In the example of display device 1, the optical path length regulating layer 35W is formed of an insulating material such as resin. For example, the optical path length regulating layer 35W is formed of acryl resin, polyimide resin, epoxy resin or the like. The optical path length regulating layer 35W is preferably formed of a material with high transparency so as to have sufficient light transmittance even if the layer 35W has large thickness. Alternatively, the optical path length regulating layer 35W may be formed of a transparent conductive material. For example, the optical path length regulating layer 35W may be formed by solvent Indium Tin Oxide (ITO). Inkjet method easily enables solvent ITO to be formed in white pixels and not in chromatic color pixels.

FIG. 4 is a diagram showing an example of a circuit formed in the circuit layer 31. As shown in FIG. 4, the circuit layer 31 includes a pixel circuit 31A formed in each pixel. The pixel circuit 31A includes a plurality of Thin Film Transistors (TFTs) 31a and 31b, and a capacitor 31c. Further, scanning signal lines 31B each extending in the X direction, video signal lines 31C each extending in the Y direction, and driving power supply lines 31D each extending in the Y direction are formed in the circuit layer 31. The pixels are arranged in lines each extending in the X direction and in columns each extending in the Y direction. The plurality of lines are arranged in the Y direction, and the plurality of columns are arranged in the X direction. The scanning signal line 31B is provided for each line of pixels. The video signal lines 31C is provided for each column of pixels. The scanning signal line 31B is sequentially selected by a scanning line driving circuit (not shown). A voltage for turning on the switching TFT 31a is applied to the selected scanning signal line 31B. A voltage corresponding to the video signal for the pixel connected to the selected scanning signal line 31B is applied to the video signal line 31C. This voltage is applied to the capacitor 31c through the switching TFT 31a. The driving TFT 31b supplies a current corresponding to the voltage applied to the capacitor 31c to the OLED 3a. As a result, the OLED 3a of the pixel corresponding to the selected scanning signal line 31B emits light. The OLED 3a includes the pixel electrode 32, the organic layer 34, and the common electrode 35 described above. A current is supplied to the OLED 3a through the driving TFT 31b from the driving power supply line 31D. The anode of the OLED 3a (that is, pixel electrode 32 in the example of display device 1) is connected to the driving TFT 31b. On the other hand, the cathode of the OLED 3a (that is, common electrode 35 in the example of display device 1) is connected to the ground potential.

Figure 5:
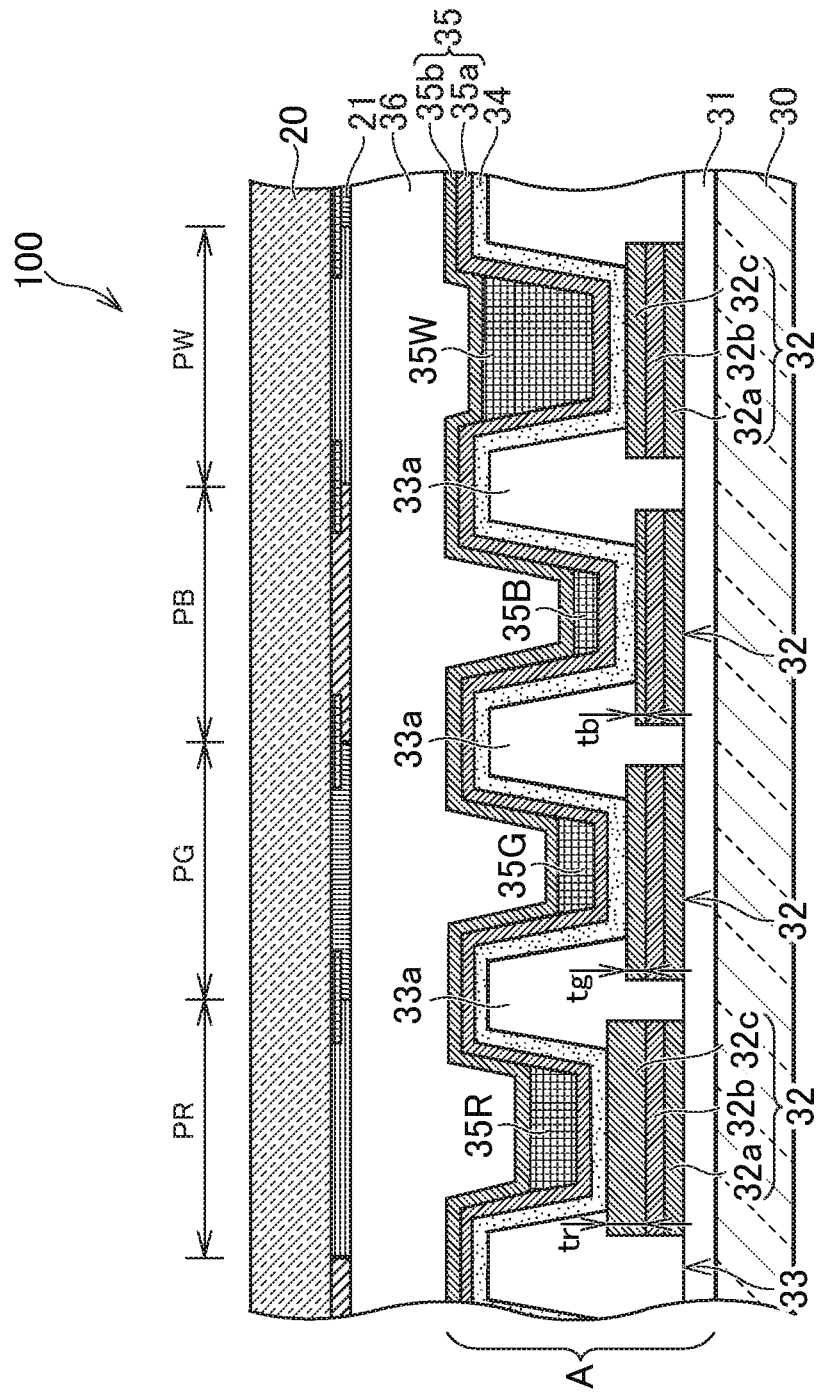
FIG. 5 illustrates another exemplary organic EL display device of embodiments according to the present invention.

FIG. 5 is a diagram showing a modified example of the organic EL display device 1. This figure shows a cross section of an organic EL display device 100 as the modified example. In FIG. 5, the same portions and layers as those described above are denoted by the same reference numerals. Features not described for display device 100 are similar to those of display device 1.

In the display device 100, the optical path length regulating layer is provided not only for the white pixel but also for the chromatic color pixels. Specifically, optical path length regulating layers 35R, 35G, and 35B are provided for the red pixel PR, the green pixel PG, and the blue pixel PB, respectively. Similarly to the optical path length regulating layer 35W of the white pixel PW, the optical path length regulating layers 35R, 35G, and 35B are formed between the transparent conductive layer 35a and the semitransparent reflecting layer 35b. The optical path length regulating layers 35R, 35G and 35B are formed inside the bank 33a of each pixel and are not formed on the upper side of the bank 33a. Therefore, the transparent conductive layer 35a and the semitransparent reflecting layer 35b are in contact with each other on the upper side of the bank 33a. This can lower the electric resistance of the common electrode 35.

Similar to the example of display device 1, in the example of display device 100, the semitransparent reflecting layer 35b and the reflecting layer 32b formed in the chromatic color pixel constitute the optical micro-cavity structure. Specifically, each of the optical path length regulating layers 35R, 35G, and 35B has thickness regulated according to the wavelength of the emission color of each chromatic color pixel. That is, the optical path length regulating layer 35R in the red pixel PR has thickness regulated according to the wavelength of the red component of light emitted from the light emitting layer of the organic layer 34. The optical path length regulating layer 35G in the green pixel PG has thickness regulated according to the wavelength of the green component of light emitted from the light emitting layer of the organic layer 34, and the optical path length regulating layer 35B in the blue pixel PB has thickness regulated according to the wavelength of the blue component of light emitted from the light emitting layer of the organic layer 34. In case that the thickness of the optical path length regulating layer 35R is defined as "Tr", the thickness of the optical path length regulating layer 35G is defined as "Tg", and the thickness of the optical path length regulating layer 35B is defined as "Tb", they have a relation of Tr>Tg>Tb. This structure of the display device 100 contributes to the appropriation of the distance from the light emitting layer of the organic layer 34 to the semitransparent reflecting layer 35b, compared with the structure of the display device 1. Similarly to the example of FIG. 2, in the example of the display device 100, the transparent conductive layer 32c of the chromatic color pixel may have thickness regulated according to the wavelength of the emission color of each chromatic color pixel as shown in FIG. 5. Alternatively, the transparent conductive layer 32c in the chromatic color pixels may have uniform thickness over a plurality of pixels having different colors.

Similarly to the optical path length regulating layer 35W of the white pixel PW, the optical path length regulating layers 35R, 35G, and 35B may be formed by, for example, an inkjet method. This method makes it relatively easy to form the optical path length regulating layers 35R, 35G, 35B having different thicknesses on the respective pixels.

Similarly to the optical path length regulating layer 35W of the white pixel PW, the optical path length regulating layers 35R, 35G, 35B are formed of an insulating material such as resin. For example, the optical path length regulating layers 35R, 35G, and 35B are formed of resin such as acryl resin.

Also in display device 100, optical pixel length regulating layer 35W is formed in white pixel PW. The optical path length regulating layer 35W has thickness regulated such that optical interference does not occur for all components of the light (red component, green component, blue component in the example of the display device 1) emitted from the light emitting layer of the organic layer 34. Specifically, the thickness of the optical path length regulating layer 35W is larger than the thickest layer among the optical path length regulating layers 35R, 35G, 35B of the chromatic color pixels. In the example of display device 100, the thickness of the optical path length regulating layer 35W is larger than the thickness Tr of the optical path length regulating layer 35R of the red pixel PR.

The present invention is not limited to the above-described embodiments, and various modifications are possible.

For example, the embodiments described above is a top emission type display device. However, the present invention may be applied to a bottom emission type display device. In this type, a semitransparent reflecting layer may be provided in the pixel electrode 32, and a reflecting layer (an opaque reflecting layer) may be provided in the common electrode 35. Even in this type, the optical path length regulating layer 35W of the white pixel PW is provided, for example, in the common electrode. That is, the optical path length regulating layer 35W of the white pixel PW is formed between the reflecting layer of the common electrode and the transparent conductive layer of the common electrode.

In still another embodiment, the reflecting layer 32b and the semitransparent reflecting layer 35b may not constitute electrodes. For example, an insulating layer may be formed on the entire upper side of the transparent conductive layer 35a constituting the common electrode 35, and a semitransparent reflecting layer 35b may be formed on the upper side of the insulating layer. In addition, an insulating layer may be formed on the upper side of the reflecting layer 32b, and a transparent conductive layer 32c constituting the pixel electrode 32 may be formed on the insulating layer.

Also, the present invention may be applied to a display device different from an organic EL display device. For example, the present invention may be applied to a display device including a light emitting layer formed of a quantum dot material instead of the light emitting layer of the organic layer 34.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a white pixel that emits white light; and
a plurality of chromatic color pixels that respectively emit light of a plurality of chromatic colors different from each other, the plurality of chromatic colors including a first color and a second color, wherein
each of the white pixel and the plurality of chromatic color pixels includes a first reflecting layer and a second reflecting layer facing to the first reflecting layer,
a distance between the first reflecting layer and the second reflecting layer in the chromatic color pixel that emits light of the first color is different from that of the chromatic color pixel that emits light of the second color,
a distance between the first reflecting layer and the second reflecting layer in the white pixel is larger than the largest distance among distances between the first reflecting layer and the second reflecting layer in the respective chromatic color pixels,
a light emitting layer is formed between the first reflecting layer and the second reflecting layer,
the white pixel and the plurality of chromatic color pixels include a transparent conductive layer employed as an electrode between the light emitting layer and the second reflecting layer,
the white pixel includes, between the transparent conductive layer and the second reflecting layer, an optical path length regulating layer to adjust the distance between the first reflecting layer and the second reflecting layer, and
the optical path length regulating layer is formed in the white pixel and is not formed in the chromatic color pixels.

2. The display device according to claim 1, wherein the optical path length regulating layer includes a resin layer.

3. The display device according to claim 1, wherein the optical path length regulating layer has a thickness greater than or equal to two micrometers.

4. The display device according to claim 1, wherein the optical path length regulating layer is formed in the plurality of chromatic color pixels and the white pixel, and
a thickness of the optical path length regulating layer in the white pixel is larger than the largest thickness among thicknesses of the optical path length regulating layer in the plurality of chromatic color pixels.

5. The display device according to claim 1, wherein the second reflecting layer employs a semitransparent reflecting layer, and
the optical path length regulating layer is formed between the transparent conductive layer and the semitransparent reflecting layer.

6. A display device comprising:
a white pixel that emits white light; and
a plurality of chromatic color pixels that respectively emit light of a plurality of chromatic colors different from each other, the plurality of chromatic colors including a first color and a second color, wherein
each of the white pixel and the plurality of chromatic color pixels includes a first reflecting layer and a second reflecting layer facing to the first reflecting layer,
a distance between the first reflecting layer and the second reflecting layer in the chromatic color pixel that emits light of the first color is different from that of the chromatic color pixel that emits light of the second color, a distance between the first reflecting layer and the second reflecting layer in the white pixel is larger than the largest distance among distances between the first reflecting layer and the second reflecting layer in the respective chromatic color pixels, the white pixel includes, between the first reflecting layer and the second reflecting layer, an optical path length regulating layer to adjust the distance between the first reflecting layer and the second reflecting layer, and the optical path length regulating layer is formed in the white pixel and is not formed in the chromatic color pixels.

7. The display device according to claim 6, wherein the optical path length regulating layer includes a resin layer.

8. The display device according to claim 6, wherein the optical path length regulating layer has a thickness greater than or equal to two micrometers.

9. The display device according to claim 6, wherein the optical path length regulating layer is formed in the plurality of chromatic color pixels and the white pixel, and a thickness of the optical path length regulating layer in the white pixel is larger than the largest thickness among thicknesses of the optical path length regulating layer in the plurality of chromatic color pixels.

10. The display device according to claim 6, wherein the second reflecting layer employs a semitransparent reflecting layer, and the optical path length regulating layer is formed between the first reflecting layer and the semitransparent reflecting layer.

* * * * *